(12) United States Patent
Nakamura

(10) Patent No.: US 7,696,012 B2
(45) Date of Patent: Apr. 13, 2010

(54) WAFER DIVIDING METHOD

(75) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/379,523

(22) Filed: Feb. 24, 2009

(65) Prior Publication Data

US 2009/0215245 A1 Aug. 27, 2009

(30) Foreign Application Priority Data

Feb. 26, 2008 (JP) .............................. 2008-044633

(51) Int. Cl.
*H01L 21/301* (2006.01)
(52) U.S. Cl. ................... 438/114; 438/463; 438/940; 257/E21.347
(58) Field of Classification Search .................... 438/33, 438/68, 114, 463, 940, FOR. 387; 257/E21.347
See application file for complete search history.

(56) References Cited

U.S. PATENT DOCUMENTS

| 7,008,861 | B2* | 3/2006 | Andrews et al. | 438/463 |
| 7,332,415 | B2* | 2/2008 | Nagai et al. | 438/463 |
| 7,399,682 | B2* | 7/2008 | Yoshikawa et al. | 438/463 |
| 2005/0003633 | A1* | 1/2005 | Mahle et al. | 438/463 |

FOREIGN PATENT DOCUMENTS

JP 3408805 3/2003

* cited by examiner

*Primary Examiner*—George Fourson
(74) *Attorney, Agent, or Firm*—Smith, Gambrell & Russell, LLP

(57) ABSTRACT

A method of dividing a wafer having a plurality of streets, which are formed in a lattice pattern on the front surface, and having devices, which are formed in a plurality of areas sectioned by the plurality of streets, into individual devices along the streets, comprising: a protective member-affixing step for affixing a protective member for protecting devices onto the front surface of the wafer; a deteriorated layer-forming step for applying a laser beam of a wavelength having permeability for the wafer from the rear surface side of the wafer along the streets to form a deteriorated layer along the streets in an area where it does not reach the final thickness of each device from the front surface of the wafer and the rear surface of the wafer in the inside of the wafer; a groove-forming step for cutting areas corresponding to the streets from the rear surface side of the wafer where the deteriorated layer has been formed along the streets to form a groove reaching the deteriorated layer; a dividing the wafer into individual devices along the streets where the deteriorated layer and the groove have been formed by exerting external force to the wafer; and a grinding the rear surface of the wafer which has been divided into individual devices until the final thickness of each device is achieved.

1 Claim, 7 Drawing Sheets

(a)

(b)

(a)

(b)

(a)

(b)

WAFER DIVIDING METHOD

FIELD OF THE INVENTION

The present invention relates to a method of dividing a wafer having a plurality of streets, which are formed in a lattice pattern on the front surface, and having devices, which are formed in a plurality of areas sectioned by the plurality of streets, along the streets.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC, LSI, liquid crystal driver or flash memory is formed in each of the sectioned areas. Individual devices are manufactured by cutting this semiconductor wafer along the streets to divide it into the areas each having a device formed thereon.

Cutting along the streets of the above semiconductor wafer is generally carried out by a cutting machine called "dicer". This cutting machine comprises a chuck table for holding a workpiece such as a semiconductor wafer or optical device wafer, a cutting means for cutting the workpiece held on the chuck table, and a cutting-feed means for moving the chuck table and the cutting means relative to each other. The cutting means includes a spindle unit that comprises a rotary spindle, a cutting blade mounted on the rotary spindle and a drive mechanism for driving the rotary spindle. The cutting blade comprises a disk-like base and an annular cutting edge which is mounted on the outer peripheral portion of the side wall of the base and formed as thick as about 20 μm by fixing diamond abrasive grains having a diameter of about 3 μm to the base by electroforming.

Since the cutting blade has a thickness of about 20 μm, however, the streets for sectioning the devices must have a width of about 50 μm. Therefore, there is a problem in that the area ratio of the streets to the wafer becomes large, thereby reducing productivity.

Meanwhile, as a means of dividing a plate-like workpiece such as a semiconductor wafer, a laser processing method in which a pulse laser beam having permeability for the workpiece is applied with its focal point set to the inside of the area to be divided is attempted and disclosed by Japanese Patent No. 3408805. In the dividing method making use of the above laser processing technique, the workpiece is divided by applying a pulse laser beam of a wavelength having permeability for the workpiece from one surface side of the workpiece with its focal point set to the inside to continuously form a deteriorated layer along the streets in the inside of the workpiece and exerting external force along the streets whose strength has been reduced by the formation of the deteriorated layers. This method makes it possible to reduce the width of the streets.

Since the deteriorated layer remains on the side faces of the obtained devices when the deteriorated layer is formed along the streets of the wafer, however, the transverse strength of each device is greatly reduced, whereby a problem will come up that the device is damaged in the subsequent step or after it becomes a product.

SUMMARY OF THE INVENTION

It is an object of the present invention to provide a wafer dividing method capable of dividing a wafer with high productivity and without reducing the transverse strength of each device.

To attain the above object, according to the present invention, there is provided a method of dividing a wafer having a plurality of streets, which are formed in a lattice pattern on the front surface, and having devices, which are formed in a plurality of areas sectioned by the plurality of streets, into individual devices along the streets, comprising:

a protective member-affixing step for affixing a protective member for protecting the devices onto the front surface of the wafer;

a deteriorated layer-forming step for applying a laser beam of a wavelength having permeability for the wafer from the rear surface side of the wafer along the streets to form a deteriorated layer along the streets in an area where it does not reach the final thickness of each device from the front surface of the wafer and the rear surface of the wafer in the inside of the wafer;

a groove-forming step for cutting areas corresponding to the streets from the rear surface side of the wafer where the deteriorated layer has been formed along the streets to form a groove reaching the deteriorated layer;

a dividing step for dividing the wafer into individual devices along the streets where the deteriorated layer and the groove have been formed by exerting external force to the wafer where the deteriorated layer and the groove have been formed along the streets; and a grinding step for grinding the rear surface of the wafer which has been divided into individual devices until the final thickness of each device is achieved.

Further, according to the present invention, there is also provided a method of dividing a wafer having a plurality of streets, which are formed in a lattice pattern on the front surface, and having devices, which are formed in a plurality of areas sectioned by the plurality of streets, into individual devices along the streets, comprising:

a protective member-affixing step for affixing a protective member for protecting the devices onto the front surface of the wafer;

a groove-forming step for forming a groove up to a position corresponding to a value obtained by adding a predetermined thickness to the final thickness of each device from the front surface of the wafer by cutting areas corresponding to the streets from the rear surface side of the wafer;

a deteriorated layer-forming step for applying a laser beam of a wavelength having permeability for the wafer from the rear surface side of the wafer through the groove to form a deteriorated layer along the streets in an area where it does not reach the final thickness of each device from the bottom surface of the groove in the inside of the wafer;

a diving step for dividing the wafer into individual devices along the streets where the deteriorated layer and the groove have been formed by exerting external force to the wafer where the deteriorated layer and the groove have been formed along the streets; and a grinding step for grinding the rear surface of the wafer which has been divided into individual devices until the final thickness of each device is achieved.

According to the wafer dividing method of the present invention, since the deteriorated layer which is formed along the streets in the inside of the wafer by the above deteriorated layer forming step is removed by carrying out the grinding step after the wafer is divided into individual devices along the deteriorated layers, the deteriorated layer does not remain on the side faces of the devices, whereby the transverse strength of the devices is not reduced.

Further, according to the wafer dividing method of the present invention, since the groove reaching the deteriorated layer is formed by cutting the areas corresponding to the streets from the rear surface side of the wafer after the deteriorated layer forming step is carried out, the deteriorated layer can be exposed to the bottom surface of the groove, whereby the wafer is easily divided along the streets with the deteriorated layer as a start point of cut-division. Therefore, as it is not necessary to repeat the deteriorated layer-forming step a plurality of times to expose the deteriorated layers to the rear surface of the wafer, productivity is improved.

DETAILED DESCRIPTION OF THE PREFERRED EMBODIMENTS

Preferred embodiments of the present invention will be described in detail hereinunder with reference to the accompanying drawings.

Figure 1:
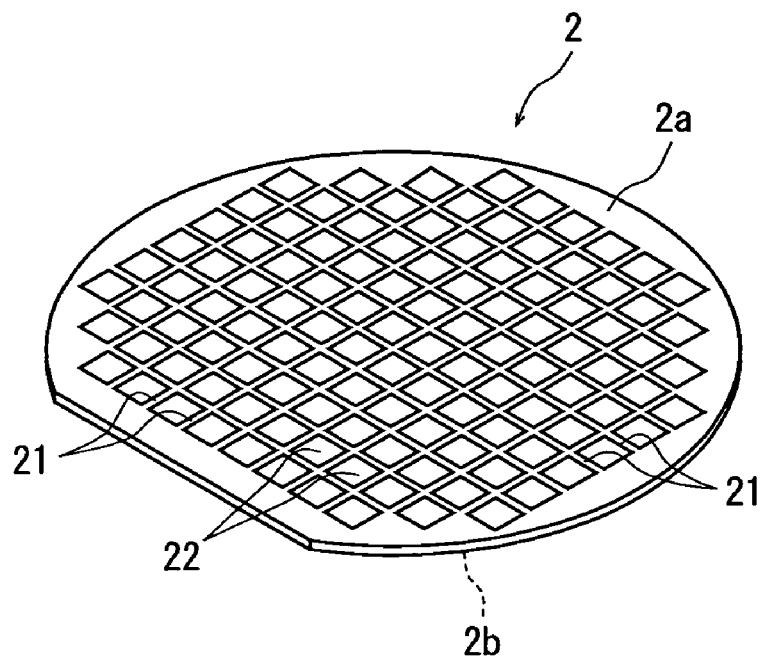
FIG. 1 is a perspective view of a semiconductor wafer to be divided by the wafer dividing method of the present invention.

FIG. 1 is a perspective view of a semiconductor wafer as a wafer to be divided according to the present invention. The semiconductor wafer 2 shown in FIG. 1 is, for example, a silicon wafer having a thickness of 600 μm, and has a plurality of streets 21, which are formed in a lattice pattern on the front surface 2a, and has a device 22 such as IC, LSI, liquid crystal driver or flash memory, which is formed in a plurality of areas sectioned by the plurality of streets 21.

A first embodiment of the method of dividing the above semiconductor wafer 2 into individual devices 22 will be described with reference to FIGS. 2 to 7.

Figure 2:
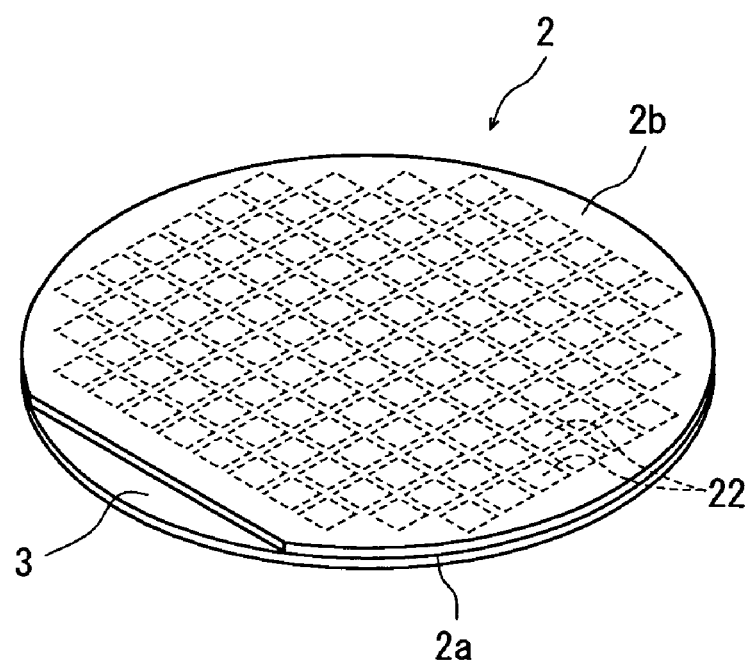
FIG. 2 is a perspective view showing a state of a protective member being affixed onto the front surface of the semiconductor wafer shown in FIG. 1.

A protective member 3 made of vinyl chloride is affixed to the front surface 2a of the above semiconductor wafer 2 as shown in FIG. 2 to protect the devices 22 (protective member-affixing step).

After the protective member 3 is affixed to the front surface 2a of the semiconductor wafer 2 by carrying out the protective member-affixing step, next comes the step of forming a deteriorated layer along the streets 21 in an area where it does not reach the final thickness of each device 22 from the front surface 2a of the semiconductor wafer 2 and the rear surface of the semiconductor wafer 2 in the inside of the semiconductor wafer 2 by applying a laser beam of a wavelength having permeability for the semiconductor wafer 2 from the rear surface side of the semiconductor wafer 2 along the streets 21. This deteriorated layer-forming step is carried out by using a laser beam processing machine shown in FIG. 3 in the illustrated embodiment. The laser beam processing machine 4 shown in FIG. 3 comprises a chuck table 41 for holding a workpiece, a laser beam application means 42 for applying a laser beam to the workpiece held on the chuck table 41, and an image pick-up means 43 for picking up an image of the workpiece held on the chuck table 41. The chuck table 41 is so constituted as to suction-hold the workpiece and is designed to be moved in a processing-feed direction indicated by an arrow X in FIG. 3 and an indexing-feed direction indicated by an arrow Y by a moving mechanism that is not shown.

The above laser beam application means 42 has a cylindrical casing 421 arranged substantially horizontally. In the casing 421, there is installed a pulse laser beam oscillation means comprising a pulse laser beam oscillator composed of a YAG laser oscillator or YVO4 laser oscillator and a repetition frequency setting means, which are not shown. A condenser 422 for converging a pulse laser beam oscillated from the pulse laser beam oscillation means is mounted on the end of the above casing 421.

The image pick-up means 43 mounted on the end portion of the casing 421 constituting the above laser beam application means 42 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown.

Figure 3:
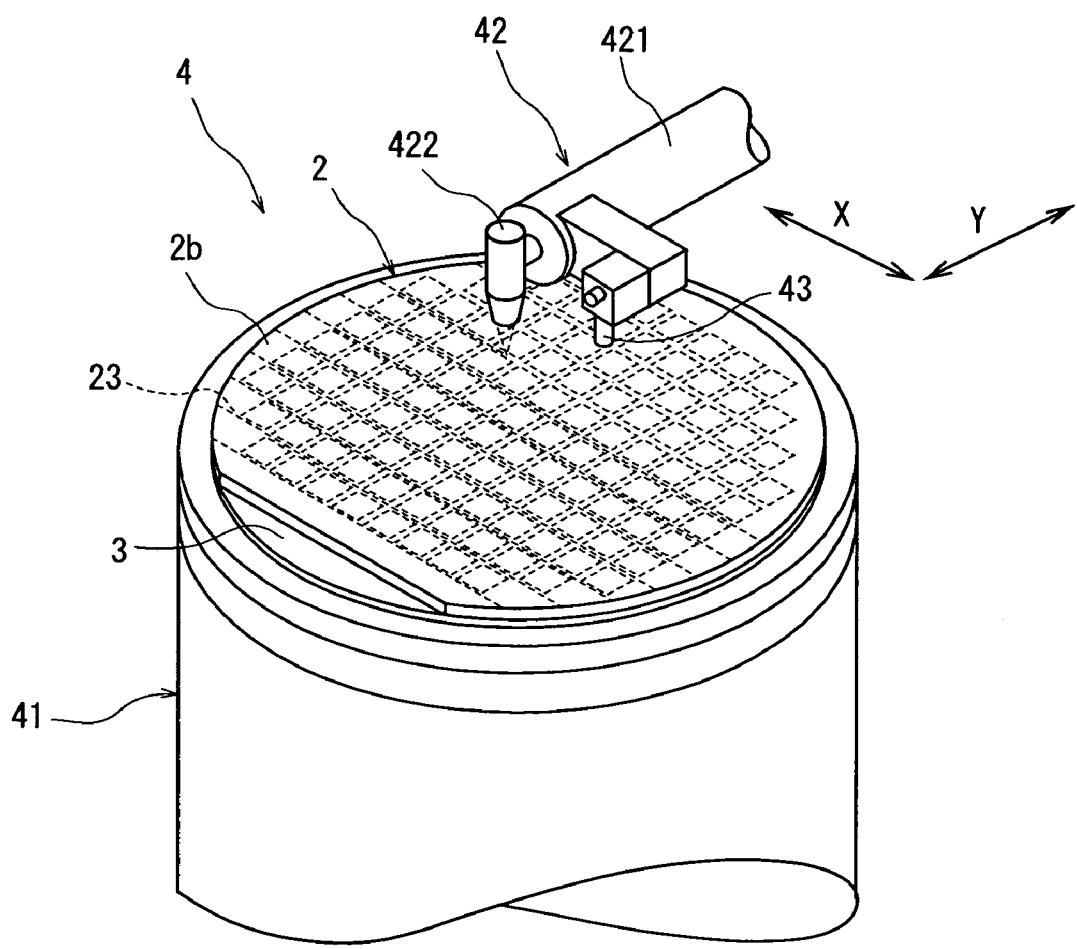
FIG. 3 is a perspective view of a laser beam processing machine for carrying out a deteriorated layer forming step in the wafer dividing method of the present invention.
Figure 4:
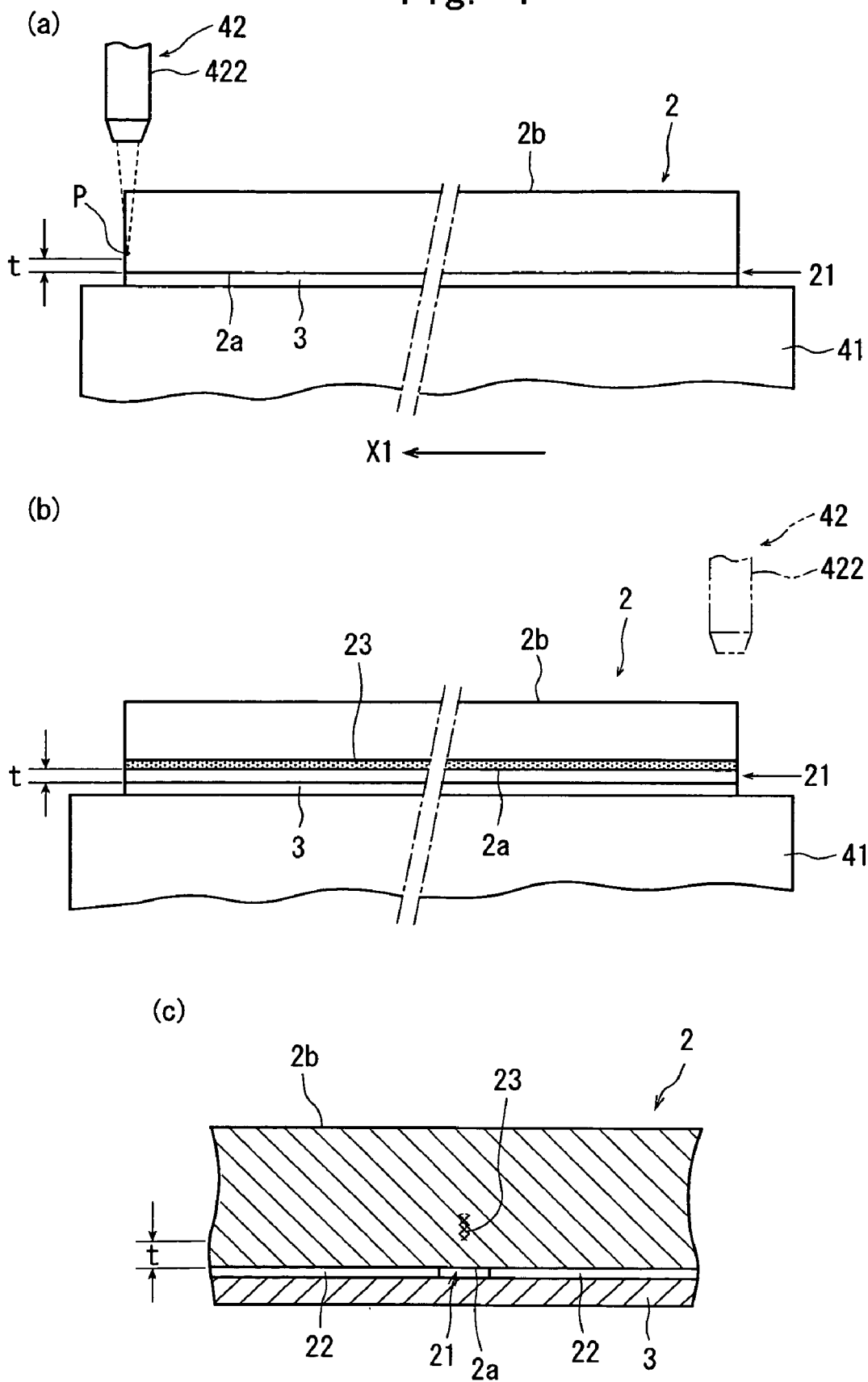
FIGS. 4(a) to 4(c) are explanatory diagrams showing the deteriorated layer forming step in a first embodiment of the wafer dividing method of the present invention.
Figure 5:
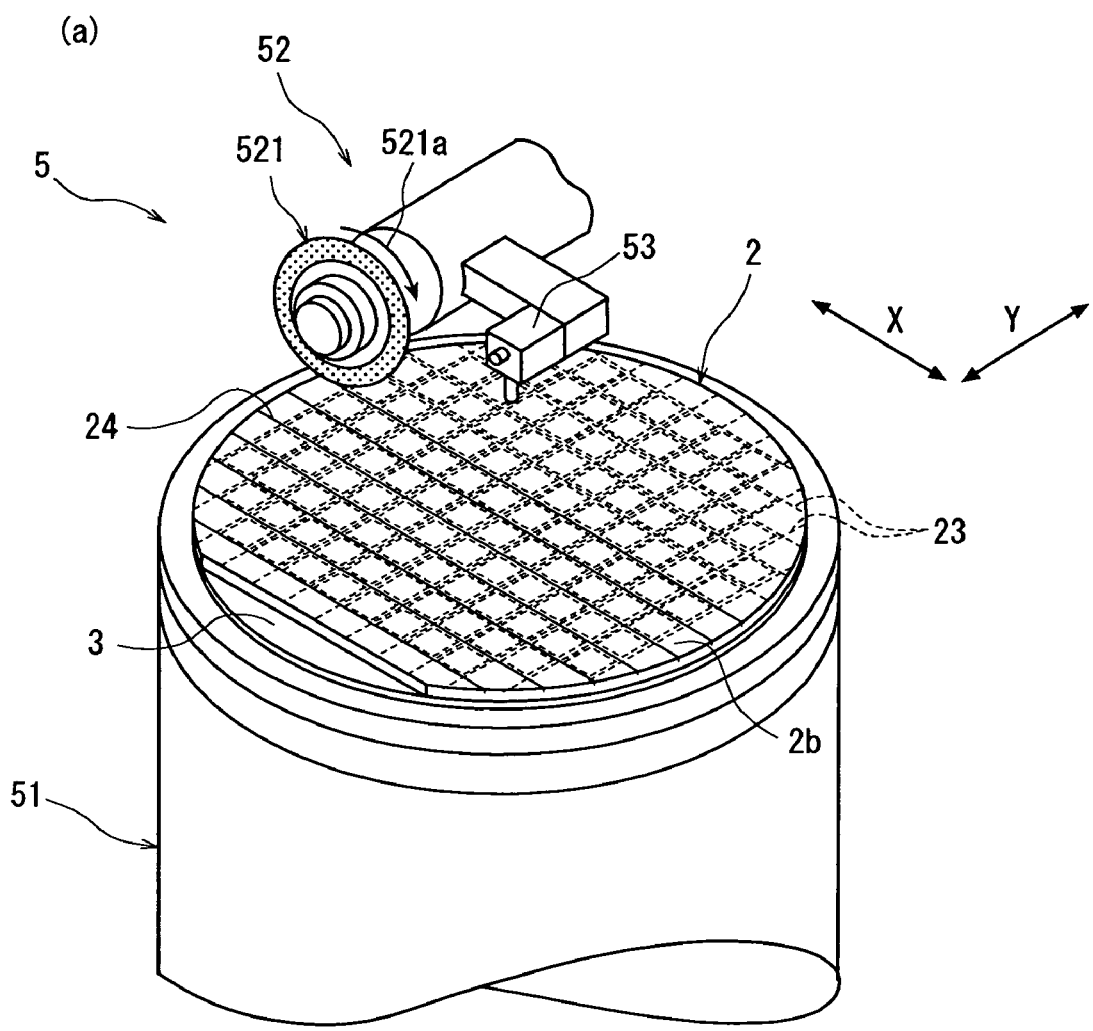
FIGS. 5(a) and 5(b) are explanatory diagrams showing a groove-forming step in the first embodiment of the wafer dividing method of the present invention.
Figure 5:
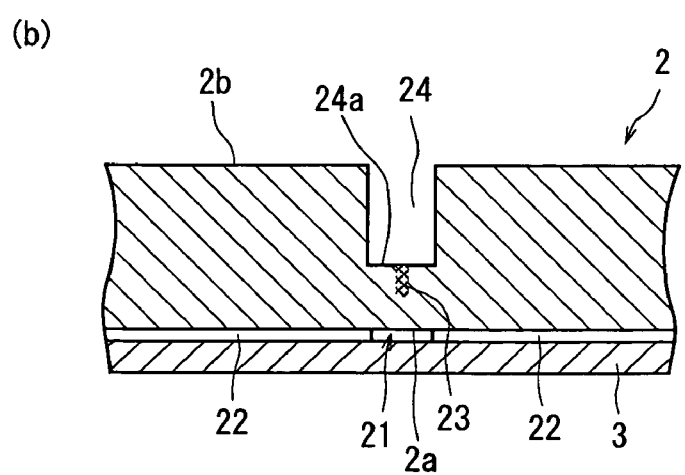
Figure 6:
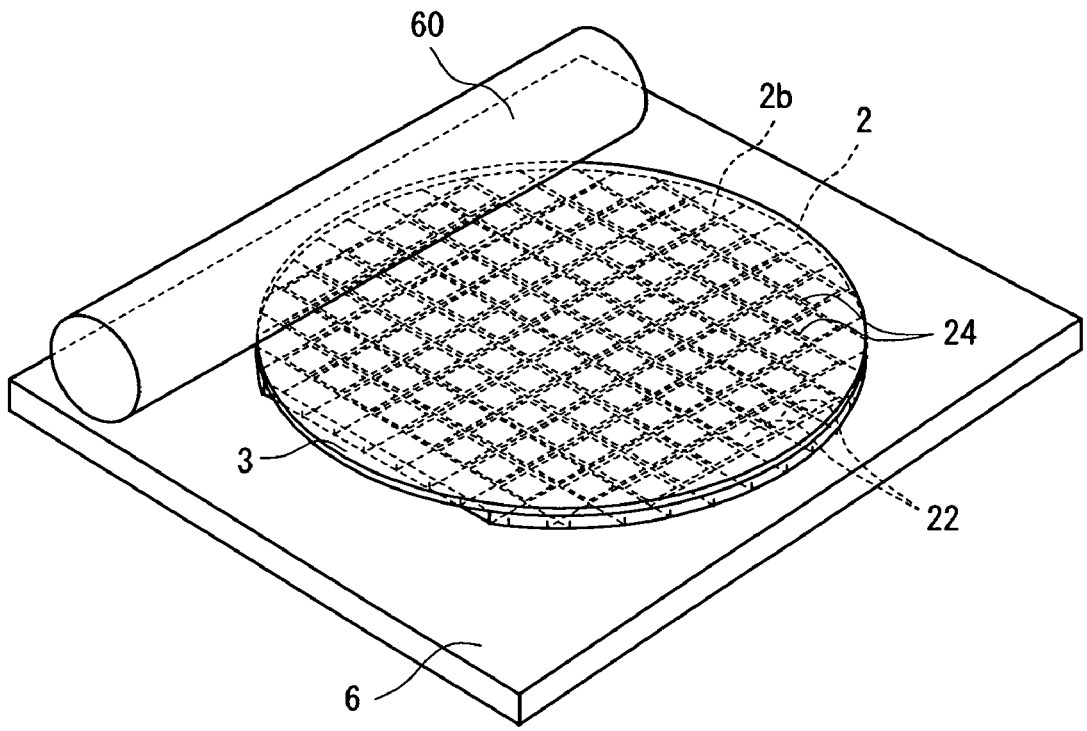
FIGS. 6(a) and 6(b) are explanatory diagrams showing a dividing step in the wafer dividing method of the present invention.
Figure 6:
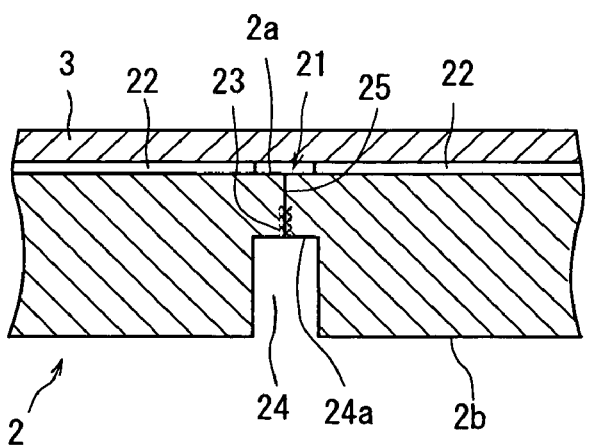
Figure 7:
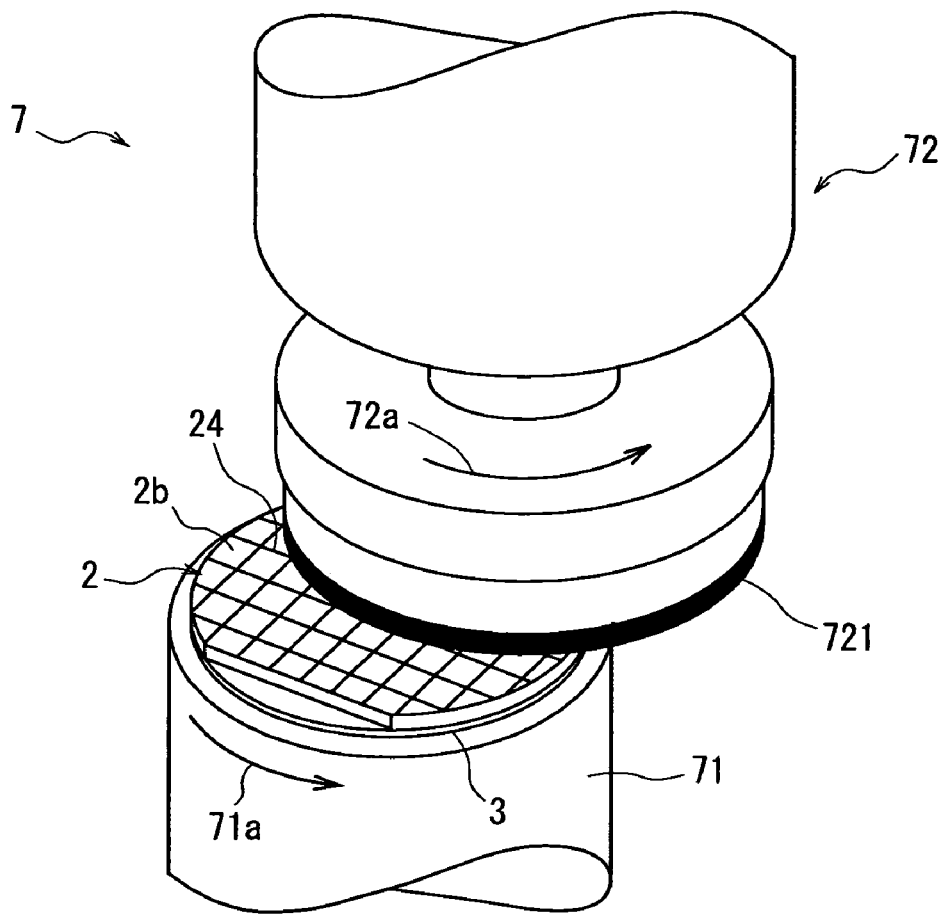
FIGS. 7(a) and 7(b) are explanatory diagrams showing a grinding step in the wafer dividing method of the present invention.
Figure 7:
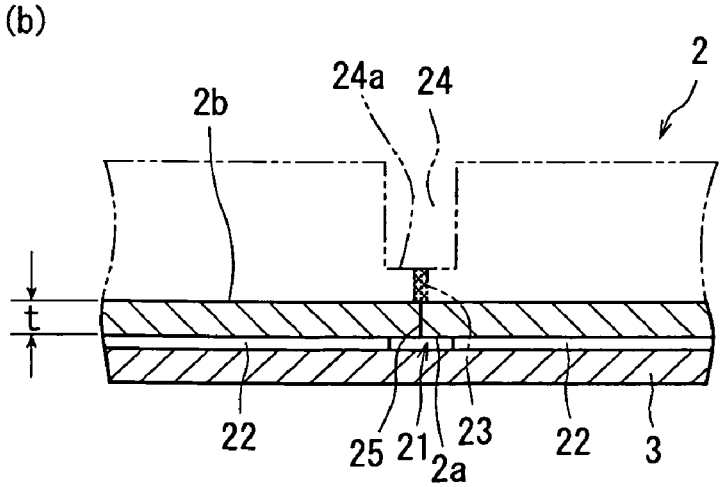

To carry out the deteriorated layer forming step by using the above-described laser beam processing machine 4, the protective member 3 side affixed to the front surface 2a of the semiconductor wafer 2 is placed on the chuck table 41 of the laser beam processing machine 4 as shown in FIG. 3. The semiconductor wafer 2 is then suction-held on the chuck table 41 by a suction means (not shown) through the protective member 3 (wafer holding step). Therefore, the rear surface 2b of the semiconductor wafer 2 suction-held on the chuck table 41 faces up.

The above wafer holding step is followed by the step of forming a deteriorated layer along the streets 21 in an area where it does not reach the final thickness of each device 22 from the front surface 2a of the semiconductor wafer 2 and the rear surface of the semiconductor wafer 2 in the inside of the semiconductor wafer 2 by applying a laser beam of a wavelength having permeability for the silicon wafer forming the semiconductor wafer 2 from the rear surface 2b side of the semiconductor wafer 2 along the streets 21. To carry out the deteriorated layer-forming step, the chuck table 41 suction-holding the semiconductor wafer 2 is first brought to a position right below the image pick-up means 43 by the moving mechanism that is not shown. Then, alignment work for detecting the area to be processed of the semiconductor wafer 2 is carried out by the image pick-up means 43 and the control means that is not shown. That is, the image pick-up means 43 and the control means (not shown) carry out image processing such as pattern matching, etc. to align a street 21 formed in a predetermined direction of the semiconductor wafer 2 with the condenser 422 of the laser beam application means 42 for applying a laser beam along the street 21, thereby performing the alignment of a laser beam application position. The alignment of the laser beam application position is also carried out on streets 21 formed on the semiconductor wafer 2 in a direction perpendicular to the above predetermined direction (alignment step). Although the front surface 2a, on which the street 21 is formed, of the semiconductor wafer 2 faces down at this point, as the image pick-up means 43 comprises infrared illuminating means, an optical system for capturing infrared radiation and an image pick-up device (infrared CCD) for outputting an electric signal corresponding to the infrared radiation as described above, an image of the street 21 can be picked up through the rear surface 2b.

After the alignment step is carried out as described above, the chuck table 41 is moved to a laser beam application area where the condenser 422 of the laser beam application means 42 for applying a laser beam is located as shown in FIG. 4(a) to bring one end (left end in FIG. 4(a)) of the predetermined street 21 to a position right below the condenser 422 of the laser beam application means 42. Then, the focal point P of a pulse laser beam is set to a position, for example, 20 μm above the final thickness (t: for example, 50 μm) of each device 22 from the front surface 2a (undersurface) of the semiconductor wafer 2. Therefore, the focal point P of the pulse laser beam is set to a position 70 μm above the front surface 2a (undersurface) of the semiconductor wafer 2. The chuck table 41 is then moved in the direction indicated by the arrow X1 in FIG. 4(a) at a predetermined feed rate while a pulse laser beam of a wavelength having permeability for the silicon wafer is applied from the condenser 422 by activating the laser beam application means 42. And, when the application position of the condenser 422 reaches the other end (right end in FIG. 4(b)) of the street 21 as shown in FIG. 4(b), the application of the pulse laser beam is suspended and the movement of the chuck table 41 is stopped. As a result, a deteriorated layer 23 is formed along the street 21 in an area where it does not reach the final thickness (t: for example, 50 μm) of each device 22 from the front surface 2a of the semiconductor wafer 2 and the rear surface 2b (top surface) of the semiconductor wafer 2 in the inside of the semiconductor wafer 2 as shown in FIGS. 4(b) and 4(c). This deteriorated layer 23 is formed as a molten and re-solidified layer.

The processing conditions in the above deteriorated layer-forming step are set as follows, for example.

Light source: LD excited Q switch Nd: YVO4 pulse laser
Wavelength: 1,064 nm
Repetition frequency: 100 kHz
Average output: 1 W
Focal spot diameter: 1 μm
Processing-feed rate: 100 mm/sec The thickness of the deteriorated layer 23 formed once under the above processing conditions is about 30 μm. Therefore, in the illustrated embodiment, the deteriorated layer 23 having a thickness of about 30 μm is formed from a position several μm above the final thickness (t: for example, 50 μm) of each device 22 in the semiconductor wafer 2.

After the above deteriorated layer-forming step is carried out along all the streets 21 extending in the predetermined direction of the semiconductor wafer 2 as described above, the chuck table 41 is turned at 90° to carry out the above deteriorated layer forming step along streets 21 extending in a direction perpendicular to the above predetermined direction.

The deteriorated layer-forming step is followed by the step of forming a groove reaching the deteriorated layer 23 by cutting areas corresponding to the streets 21 from the rear surface 2b of the semiconductor wafer 2 where the deteriorated layer 23 has been formed along the streets 21. This groove-forming step is carried out by using a cutting machine 5 shown in FIG. 5(a). The cutting machine 5 shown in FIG. 5(a) comprises a chuck table 51 for holding a workpiece, a cutting means 52 having a cutting blade 521 for cutting the workpiece held on the chuck table 51, and an image pick-up means 53 for picking up an image of the workpiece held on the chuck table 51. The image pick-up means 53 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation in the illustrated embodiment. An image signal is supplied to a control means that is not shown. To carry out the groove-forming step by using the cutting machine 5 constituted as described above, the protective member 3 side affixed to the front surface 2a of the semiconductor wafer 2 which has undergone the above deteriorated layer forming step is placed on the chuck table 51. Therefore, the rear surface 2b of the semiconductor wafer 2 faces up. By activating a suction means that is not shown, the semiconductor wafer 2 is held on the chuck table 51 through the protective member 3. The chuck table 51 suction-holding the semiconductor wafer 2 as described above is positioned right below the image pick-up means 53 by a cutting-feed mechanism that is not shown.

After the chuck table 51 is brought to a position right below the image pick-up means 53, alignment work for detecting the area to be cut of the semiconductor wafer 2 is carried out by the image pick-up means 53 and a control means that is not shown. That is, the image pick-up means 53 and the control means (not shown) carry out image processing such as pattern matching, etc. to align a street 21 formed in a predetermined direction of the semiconductor wafer 2 with the cutting blade 521, thereby performing the alignment of a cutting area (alignment step). The alignment of the cutting area is also carried out on streets 21 formed on the semiconductor wafer 2 in a direction perpendicular to the above predetermined direction. Although the front surface 2a, on which the street 21 are formed, of the semiconductor wafer 2 faces down at this point, as the image pick-up means 53 comprises an infrared illuminating means, an optical system for capturing infrared radiation and an image pick-up device (infrared CCD) for outputting an electric signal corresponding to the infrared radiation or the like, an image of the street 21 can be picked up through the rear surface 2b.

After the alignment work for detecting the area to be cut of the semiconductor wafer 2 held on the chuck table 51 is carried out as described above, the chuck table 51 holding the semiconductor wafer 2 is moved to the cutting start position of the area to be cut. The cutting blade 521 is moved down a predetermined distance (i.e., cutting-in feed amount) in a direction indicated by an arrow 521a in FIG. 5(a), while it is rotated. This cutting-in feed position is set to a position where the outer periphery of the cutting blade 521 reaches the above deteriorated layer 23 from the rear surface 2b (top surface) of the semiconductor wafer 2. After the cutting-in feed work of the cutting blade 521 is carried out as described above, the chuck table 51 is moved (cutting-fed) in the direction indicated by the arrow X in FIG. 5(a) while the cutting blade 521 is rotated, to form a groove 24 reaching the deteriorated layer 23 along the street 21 from the rear surface 2b of the semiconductor wafer 2, as shown in FIG. 5(b) (groove-forming step). Therefore, the deteriorated layer 23 is exposed to the bottom surface 24a of the groove 24.

The above-described groove-forming step is carried out on the areas corresponding to all the streets 21.

Next comes the step of dividing the semiconductor wafer 2 into individual devices 22 along the streets 21 where the deteriorated layer 23 and the groove 24 have been formed, by exerting external force to the semiconductor wafer 2 where the deteriorated layer 23 and the groove 24 have been formed along the streets 21. That is, this wafer dividing step is carried out by first placing the rear surface 2b of the semiconductor wafer 2 on a flexible rubber sheet 6 in such a manner that the protective member 3 affixed onto the front surface 2a of the semiconductor wafer 2 which has undergone the above groove forming step, faces up, as shown in FIG. 6(a). Then, by pressing the top surface of the protective member 3 with a roller 60, a cut-divided portion 25 is formed along the streets 21 whose strength has been reduced by the formation of the deteriorated layer 23 to divide the semiconductor wafer 2 into individual devices 22, as shown in FIG. 6(b). At this point, the semiconductor wafer 2 is easily divided along the streets 21 as the deteriorated layer 23 formed along the streets 21 and exposed to the bottom surface 24a of the groove 24 serves as a start point of cut-division. Since the front surface 2a of the divided semiconductor wafer 2 is affixed to the protective member 3, the devices 22 do not fall apart and the form of the semiconductor wafer 2 is maintained.

The dividing step is followed by the step of grinding the rear surface of the semiconductor wafer 2 divided into individual devices 22 until the final thickness of each device 22 is achieved. This grinding step is carried out by using a grinding machine shown in FIG. 7(a). The grinding machine 7 shown in FIG. 7(a) comprises a chuck table 71 for holding a workpiece and a grinding means 72 having a grinding whetstone 721 for grinding the workpiece held on the chuck table 71. To carry out the grinding step by using the grinding machine 7 constituted as described above, the protective member 3 side affixed onto the front surface 2a of the semiconductor wafer 2 which has undergone the dividing step is placed on the chuck table 71. Therefore, the rear surface 2b of the semiconductor wafer 2 faces up. The semiconductor wafer 2 is then held on the chuck table 71 by activating a suction means that is not shown. The grinding whetstone 721 of the grinding means 72 is rotated at, for example, 6,000 rpm in a direction indicated by an arrow 72a and brought into contact with the rear surface 2b of the semiconductor wafer 2 while the chuck table 71 is rotated at, for example, 300 rpm in a direction indicated by an arrow 71a to grind the rear surface 2b of the semiconductor wafer 2. By grinding until the semiconductor wafer 2 that has been divided into individual devices 22 achieves the final thickness (t: for example, 50 µm), the deteriorated layers 23 are removed, as shown in FIG. 7(b).

Since the deteriorated layer does not remain on the side faces of the individual devices 22 from which the deteriorated layers 23 have been removed, the transverse strength of each device 22 does not lower.

Further, since the area corresponding to the street 21 is cut from the rear surface 2b of the semiconductor wafer 2 to form a groove 24 reaching the deteriorated layer 23 after the deteriorated layer-forming step in the above-described embodiment, the deteriorated layer 23 can be exposed to the bottom surface 24a of the groove 24, whereby the semiconductor wafer 2 is easily divided along the street 21 with the deteriorated layer 23 as a start point of cut-division. Therefore, as it is not necessary to repeat the deteriorated layer-forming step a plurality of times in order to expose the deteriorated layers to the rear surface of the semiconductor wafer 2, productivity is improved.

A description will be subsequently given of a second embodiment of the method of dividing the semiconductor wafer 2 into individual devices 22.

Figure 8:
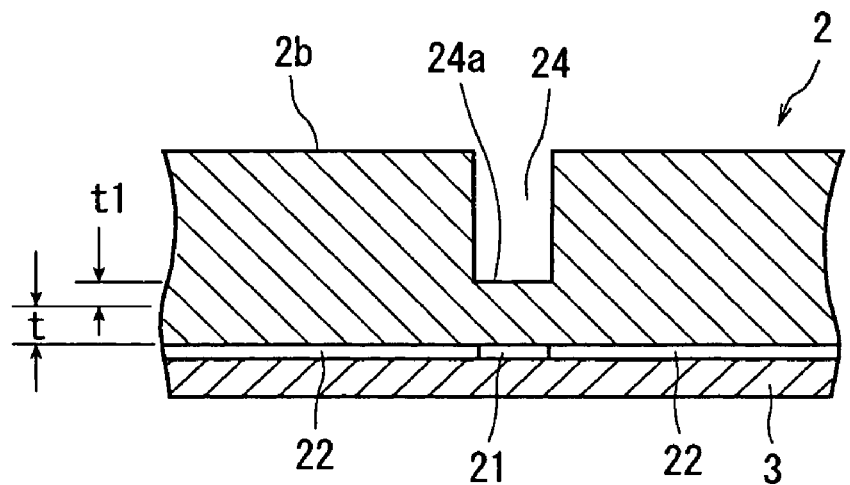
FIG. 8 is an enlarged sectional view of the principal portion of the semiconductor wafer which has undergone the groove-forming step in a second embodiment of the wafer dividing method of the present invention.

In the second embodiment, the order of the above deteriorated layer-forming step and the above groove-forming step in the first embodiment is reversed. That is, in the second embodiment, first comes the step of forming a groove up to a position corresponding to a value obtained by adding a predetermined thickness to the final thickness of each device 22 from the front surface 2a of the semiconductor wafer 2 by cutting the area corresponding to the street 21 from the rear surface side of the semiconductor wafer 2 which has undergone the above protective member-affixing step. This groove-forming step is carried out by using the cutting machine shown in FIG. 5(a). By carrying out the groove-forming step by using the cutting machine 5, the groove 24 is formed up to a position obtained by adding the predetermined thickness (t1: for example, 30 µm) to the final thickness of each device 22 (t: for example, 50 µm) from the front surface 2a, in the semiconductor wafer 2, as shown in FIG. 8. The predetermined thickness (t1) corresponds to the thickness of the deteriorated layer formed by the deteriorated layer-forming step.

Figure 9:
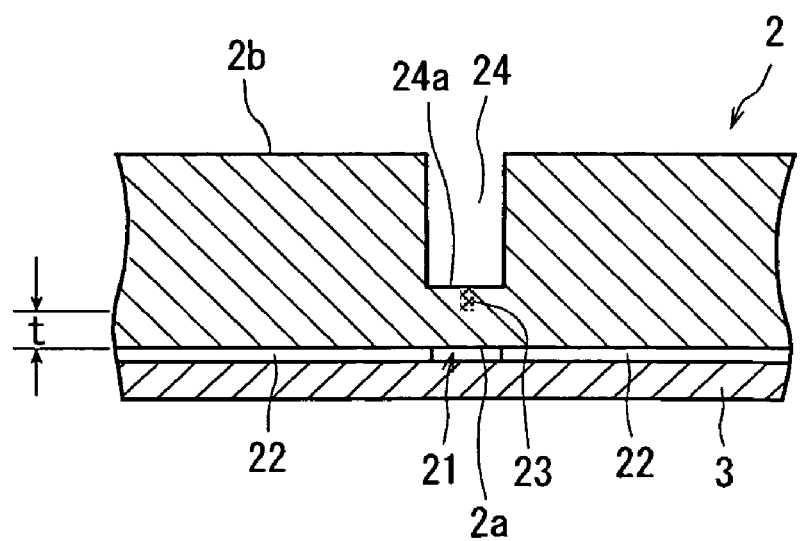
FIG. 9 is an enlarged sectional view of the principal portion of the semiconductor wafer which has undergone the deteriorated layer forming step in the second embodiment of the wafer dividing method of the present invention.

The above groove-forming step is followed by the step of forming a deteriorated layer along the streets 21 from the bottom surface 24a of the groove 24 to a position where it does not reach the final thickness of each device 22 by applying a laser beam of a wavelength having permeability for the semiconductor wafer 2 from the rear surface 2b side of the semiconductor wafer 2 through the groove 24 with its focal point set to the inside of the semiconductor wafer 2. This deteriorated layer-forming step is carried out by using the laser beam processing machine 4 shown in FIG. 3. By carrying out the above deteriorated layer-forming step by using the laser beam processing machine 4, a deteriorated layer 23 is formed in the semiconductor wafer 2 along the streets 21 from the bottom surface 24a of the groove 24 to a position where it does not reach the final thickness (t: for example, 50 µm) of each device 22, as shown in FIG. 9. After the groove-forming step and the deteriorated layer-forming step, the dividing step and the grinding step are carried out in the second embodiment similarly to the first embodiment.

What is claimed is:

1. A method of dividing a wafer having a plurality of streets, which are formed in a lattice pattern on the front surface, and having devices, which are formed in a plurality of areas sectioned by the plurality of streets, into individual devices along the streets, comprising:

a protective member-affixing step for putting a protective member for protecting the devices onto the front surface of the wafer;

a deteriorated layer-forming step for applying a laser beam of a wavelength having permeability for the wafer from the rear surface side of the wafer along the streets to form a deteriorated layer along the streets in an area where it does not reach the final thickness of each device from the front surface of the wafer and the rear surface of the wafer in the inside of the wafer;

a groove-forming step for cutting areas corresponding to the streets from the rear surface side of the wafer where the deteriorated layer has been formed along the streets to form a groove reaching the deteriorated layer;

a dividing step for dividing the wafer into individual devices along the streets where the deteriorated layer and the groove have been formed by exerting external force to the wafer where the deteriorated layer and the groove have been formed along the streets; and a grinding step for grinding the rear surface of the wafer which has been divided into individual devices until the final thickness of each device is achieved.

* * * * *